(12) United States Patent
Chang et al.

(10) Patent No.: US 9,762,334 B2
(45) Date of Patent: Sep. 12, 2017

(54) PHOTONIC INTEGRATED CIRCUIT USING CHIP INTEGRATION

(71) Applicant: Alcatel-Lucent USA Inc., Murray Hill, NJ (US)

(72) Inventors: Chia-Ming Chang, Matawan, NJ (US); Guilhem de Valicourt, Jersey City, NJ (US)

(73) Assignee: Alcatel-Lucent USA Inc., Murray Hill, NJ (US)

( * ) Notice: Subject to any disclaimer, the term of this patent is extended or adjusted under 35 U.S.C. 154(b) by 66 days.

(21) Appl. No.: 14/985,875

(22) Filed: Dec. 31, 2015

(65) Prior Publication Data

US 2017/0195064 A1 Jul. 6, 2017

(51) Int. Cl.
*G02B 6/26* (2006.01)
*G02B 6/42* (2006.01)
(Continued)

(52) U.S. Cl.
CPC ......... *H04B 10/801* (2013.01); *H01S 5/0625* (2013.01); *H01S 5/18361* (2013.01);
(Continued)

(58) Field of Classification Search
CPC ... H04B 10/801; H04B 10/803; H01S 5/0625; H01S 5/3013; H01S 5/3031;
(Continued)

(56) References Cited

U.S. PATENT DOCUMENTS 4,887,877 A 12/1989 Inoue et al.
6,298,187 B1 * 10/2001 Waarts ............... G02B 6/29319
372/6

(Continued)

FOREIGN PATENT DOCUMENTS

EP 0617303 A1 9/1994
WO WO2007021041 A1 2/2007

OTHER PUBLICATIONS

"A single adiabatic microring-based laser in 220 nm silicon-on-insulator" by Yang et al, Optics Express, vol. 22, No. 1, pp. 1172-1180, 2014.*

(Continued)

*Primary Examiner* — Robert Tavlykaev
(74) *Attorney, Agent, or Firm* — Mendelsohn Dunleavy, P.C.; Yuri Gruzdkov

(57) ABSTRACT

We disclose a photonic integrated circuit (PIC) having a first photonic chip and a second photonic chip that are bonded and optically coupled to one another in a manner that reduces the number of different photonic chips that need to be integrated into the same PIC package to achieve a desired electro-optical function. In an example embodiment, the first photonic chip may include active optical components, such as lasers and optical amplifiers, and be fabricated using the III-V semiconductor technology. The second photonic chip may include additional optical components, such as modulators, photodetectors, and passive optical components, and be fabricated using the CMOS technology. The second photonic chip may also include one or more 2×2 optical couplers configured to appropriately (re)direct various optical signals between the active optical components of the first photonic chip and the additional optical components of the second photonic chip to achieve the desired electro-optical function.

20 Claims, 4 Drawing Sheets

(51) Int. Cl.
*H04B 10/80* (2013.01)
*H01S 5/183* (2006.01)
*H01S 5/0625* (2006.01)
*H04Q 11/00* (2006.01)

(52) U.S. Cl.
CPC .............. *H04Q 2011/0041* (2013.01); *H04Q 2011/0058* (2013.01)

(58) Field of Classification Search
CPC ............. H01S 5/1092; H01S 5/18361; H01S 5/18377; H01S 5/1838
USPC .................................. 385/14–16, 21, 42, 46
See application file for complete search history.

(56) References Cited

U.S. PATENT DOCUMENTS

| | | |
|---|---|---|
| 7,702,197 B2 | 4/2010 | Nakagawa |
| 7,859,745 B2 | 12/2010 | Tanaka et al. |
| 7,995,921 B2 | 8/2011 | Grubb |
| 8,722,464 B2 | 5/2014 | Dallesasse |
| 8,750,654 B2 | 6/2014 | Dupuis et al. |
| 8,837,869 B2 | 9/2014 | Akutsu et al. |
| 9,059,559 B2 | 6/2015 | Zhang et al. |
| 9,551,832 B1* | 1/2017 | Bovington .......... H01S 5/02248 |
| 2004/0100689 A1 | 5/2004 | Fasham et al. |
| 2004/0105677 A1* | 6/2004 | Hamada ............. G02B 6/12007 398/79 |
| 2005/0123234 A1 | 6/2005 | Kanie et al. |
| 2006/0239612 A1 | 10/2006 | De Dobbelaere et al. |
| 2008/0044128 A1 | 2/2008 | Kish, Jr. et al. |
| 2010/0142889 A1 | 6/2010 | Kwon et al. |
| 2012/0027041 A1 | 2/2012 | Yamazaki |
| 2012/0183254 A1 | 7/2012 | Inoue |
| 2012/0213467 A1 | 8/2012 | Thacker et al. |
| 2013/0182731 A1 | 7/2013 | Whitbread et al. |
| 2014/0203175 A1 | 7/2014 | Kobrinsky et al. |
| 2014/0254978 A1 | 9/2014 | Koch et al. |
| 2015/0139264 A1* | 5/2015 | Zhang ..................... H01S 5/141 372/107 |
| 2015/0180201 A1 | 6/2015 | Zhang et al. |

OTHER PUBLICATIONS

Qiu, B.C., "Component Design and Fabrication of a Monolithically Integrated Polarisation Insensitive 2×2 Optical Packet Switch in InP," The 15th Annual Meeting of the IEEE Lasers and Electro-Optics Society, 2002, vol. 1, pp. 41-42.
Zhao, J., et al., "On-chip laser with multimode interference reflectors realized in a generic integration platform," Compound Semiconductor Week (CSW/IPRM), 2011 and 23rd International Conference on Indium Phosphide and Related Materials, IEEE, pp. 1-4.
Galán, J.V., et al., "Low-loss coupling technique between SOI waveguides and standard single-mode fibers," European Conference on Integrated Optics, 2007 13th ECIO, Copenhagen, Denmark, ThG11, pp. 1-4.
Poustie, A., "Hybrid Integration for Advanced Photonic Devices," Proc. SPIE, vol. 7135, 713502, pp. 1-10.
Liu, Jifeng, et al., "Ge-on-Si laser operating at room temperature," Optics Letters, 2010, vol. 35, No. 5, pp. 679-681.
Camacho-Aguilera, Rodolfo E., et al., "An electrically pumped germanium laser," Optics Express, 2012, vol. 20, No. 10 (5 pages).
Izuhara, T., et al., "Photonic integrated circuits based on silica and polymer PLC," Optoelectronic Integrated Circuits XV, 2013, Proc. of SPIE, vol. 8628 (7 pages).
Masini, G., et al., "CMOS photonics for optical engines and interconnects," Optical Fiber Communication Conference and Exposition (OFC/NFOEC), 2012 and the National Fiber Optic Engineers Conference OFC/NFOEC Technical Digest, Optical Society of America, 2012 (3 pages).
Reboul, J. R., et al., "Continuous-wave operation above room temperature of GaSb-based laser diodes grown on Si," AIP Publishing, Applied Physics Letters 99, 2011 (4 pages).
Hyundai, Park, et al., "Device and Integration Technology for Silicon Photonic Transmitters," IEEE Journal of Selected Topics in Quantum Electronics, 2011, vol. 17, No. 3, pp. 671-688.
Urino, Yutaka, et al., "First demonstration of high density optical interconnects integrated with lasers, optical modulators, and photodetectors on single silicon substrate," Optical Society of America, 2011, Optics Express, vol. 19, No. 26, pp. B159-B165.
Sato, K., "High Output Power and Narrow Linewidth Silicon Photonic Hybrid Ring-Filter External Cavity Wavelength Tunable Lasers," European Conference on Optical Communication (ECOC), 2014, (3 pages).
Liu, Alan Y., et al., "High performance continuous wave 1.3 μm quantum dot lasers on silicon," Applied Physics Letters 104(4), 041104, 2014, (5 pages).
Duan, Guang-Hua, et al., "Hybrid III-V on Silicon Lasers for Photonic Integrated Circuits on Silicon," IEEE Journal of Selected Topics in Quantum Electronics, 2014, vol. 20, No. 4 (13 pages).
Fang, Alexander W., et al., "Hybrid silicon evanescent devices," Materials Today, 2007, vol. 10, No. 7-8, pp. 28-35.
Duan, Guang-Hua, et al., "Hybrid III-V on Silicon lasers for photonic integrated circuits on Silicon," IEEE Photonics Society, IEEE Journal of Selected Topics in Quantum Electronics, 2014, vol. 20, No. 4, pp. 1-13.
Heck, Martijn J.R., et al., "Hybrid Silicon Photonic Integrated Circuit Technology," IEEE Journal of Selected Topics in Quantum Electronics, 2013, vol. 19, No. 4 (17 pages).
Zhang, Yi, et al., "Quantum dot SOA/silicon external cavity multiwavelength laser," Optical Society of America, Optics Express, 2015, vol. 23, No. 4, pp. 4666-4671.
Coldren, L.A., et al., "High Performance InP-Based Photonic ICs—A Tutorial," Journal of Lightwave Technology, vol. 29, No. 4, pp. 554-570.
International Search Report and Written Opinion; dated Mar. 30, 2017 for PCT Application No. PCT/US2016/066867.

* cited by examiner

100

400

PHOTONIC INTEGRATED CIRCUIT USING CHIP INTEGRATION

BACKGROUND

Field

The present disclosure relates to optical communication equipment and, more specifically but not exclusively, to photonic integrated circuits.

Description of the Related Art

This section introduces aspects that may help facilitate a better understanding of the disclosure. Accordingly, the statements of this section are to be read in this light and are not to be understood as admissions about what is in the prior art or what is not in the prior art.

Photonic integrated circuits (PICs) are used for various applications in telecommunications, instrumentation, and signal-processing fields. A PIC typically uses optical waveguides to implement and/or interconnect various circuit components, such as optical switches, couplers, routers, splitters, multiplexers/demultiplexers, filters, modulators, phase shifters, lasers, amplifiers, wavelength converters, optical-to-electrical (O/E) and electrical-to-optical (E/O) signal converters, etc. PICs generally enable the production of more-compact, more-cost-effective, and/or better-performing optical systems, e.g., as compared to the corresponding optical systems that are based on discrete optical components. For at least this reason, various types of integration for use in PIC manufacturing are being currently actively developed.

SUMMARY OF SOME SPECIFIC EMBODIMENTS

Disclosed herein are various embodiments of a PIC having a first photonic chip and a second photonic chip that are bonded and optically coupled to one another in a manner that beneficially reduces the number of different photonic chips that need to be integrated into the same PIC package to achieve a desired electro-optical function. In an example embodiment, the first photonic chip may include active optical components, such as lasers and optical amplifiers, and be fabricated using the III-V semiconductor technology. The second photonic chip may include additional optical components, such as modulators, photodetectors, and passive optical components, and be fabricated using the CMOS technology. The second photonic chip may also include one or more 2×2 optical couplers configured to appropriately (re)direct various optical signals between the active optical components of the first photonic chip and the additional optical components of the second photonic chip to achieve the desired electro-optical function.

According to an embodiment, the PIC comprises: a first photonic chip having a first plurality of optical waveguides; and a second photonic chip having a second plurality of optical waveguides and a third plurality of optical waveguides, the second photonic chip being bonded to the first photonic chip to optically couple two or more optical waveguides of the second plurality to respective optical waveguides of the first plurality. The second photonic chip comprises a first 2×2 optical coupler connected between first and second optical waveguides of the second plurality and first and second optical waveguides of the third plurality, the first 2×2 optical coupler being configured to: split light received from the first optical waveguide of the third plurality into first and second portions and couple (i) the first portion into the first optical waveguide of the second plurality and (ii) the second portion into the second optical waveguide of the second plurality; and couple light beams received from the first and second optical waveguides of the second plurality into the second optical waveguide of the third plurality in a manner that causes substantially no light of the light beams to be coupled into the first optical waveguide of the third plurality.

BRIEF DESCRIPTION OF THE DRAWINGS

Other aspects, features, and benefits of various disclosed embodiments will become more fully apparent, by way of example, from the following detailed description and the accompanying drawings, in which.

DETAILED DESCRIPTION

Figure 1:
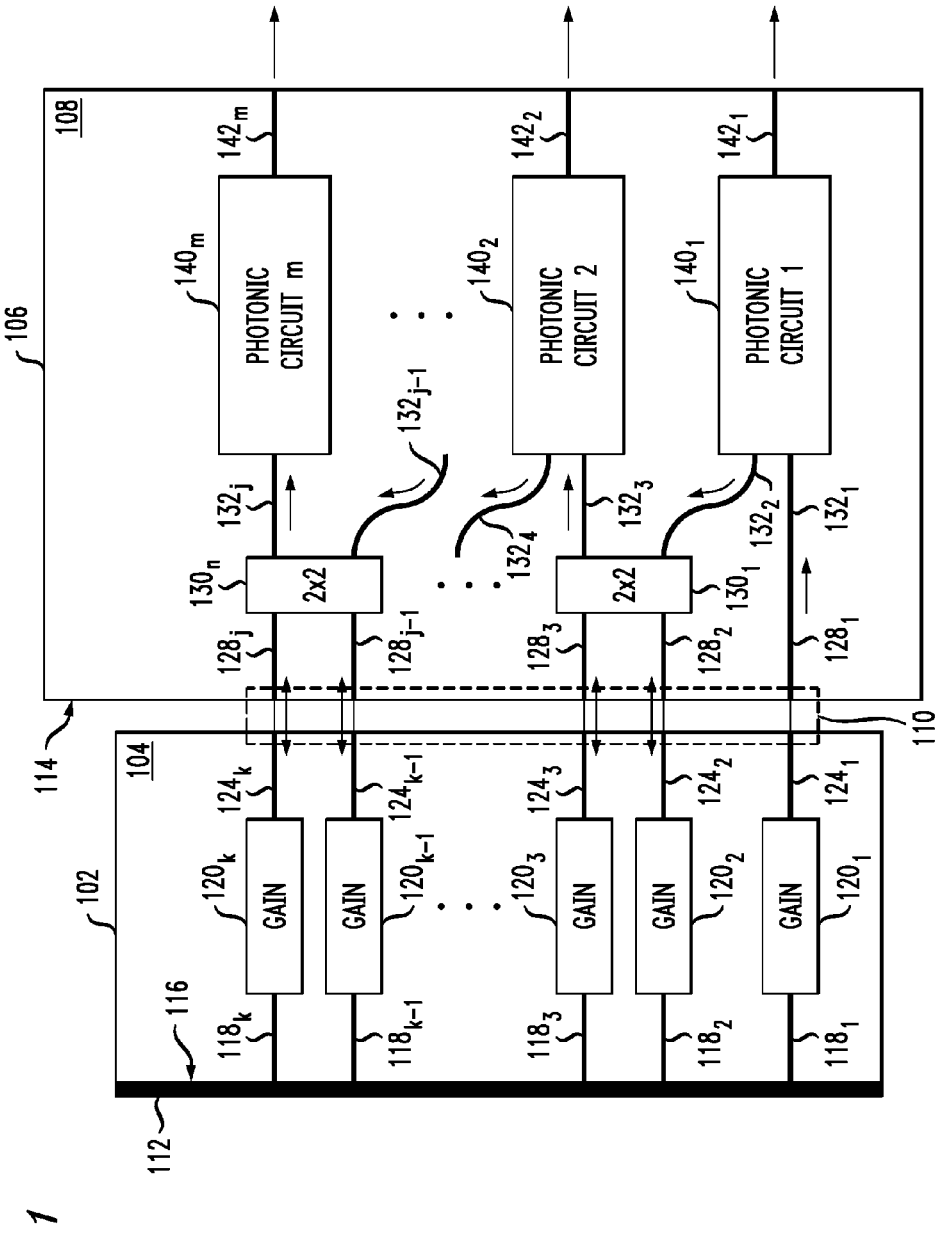
FIG. 1 shows a block diagram of a photonic integrated circuit (PIC) according to an embodiment.

The ability to effectively combine different optical components via photonic-circuit integration is widely recognized as one of the key enabling technologies in the field of industrial photonics. It is also acknowledged that using a single material platform for photonic integration is not always viable for attaining all desired electro-optical functions. For example, III-V semiconductor compounds and alloys offer well-known advantages for the implementation of lasers and optical amplifiers. However, the III-V semiconductor compounds and alloys provide only a modest index-of-refraction contrast between the core and cladding materials and may suffer from relatively high light-propagation losses in the spectral bands used in telecommunications applications. On the other hand, a silicon-based material platform offers low-loss, compact circuits that can integrate photonic and microelectronic circuit elements on the same chip. The corresponding fabrication processes are compatible with the complementary metal-oxide-semiconductor (CMOS) technology and, as such, are accurate and mature, leading to a robust yield and relatively low production costs. However, the silicon-based material platform does not yet provide practical light sources suitable for telecommunications applications.

These and certain other problems can be addressed using various embodiments of a photonic integrated circuit (PIC) disclosed herein. In an example embodiment, the PIC comprises at least two photonic chips bonded together in a single integrated-circuit (IC) package. A first of the two photonic chips may include active optical components, such as lasers and optical amplifiers, and be fabricated, e.g., using the III-V semiconductor technology. A second of the two photonic chips may include additional optical components and be fabricated, e.g., using the CMOS technology. The chip integration and chip-to-chip optical coupling used in the PIC are specifically designed and configured to reduce or minimize the number of different chips that need to be integrated into the same IC package to achieve a desired electro-optical function, thereby beneficially reducing the technical complexity of the required optical alignment and/or the end cost of the resulting IC package.

As used herein, the term "active component" refers to a photonic-circuit component or element that is capable of generating new light and/or increasing the power of an optical signal. Examples of active optical components include but are not limited to semiconductor lasers, E/O converters, and semiconductor optical amplifiers (SOAs). The term "passive component" refers to a photonic-circuit component or element that is designed to transfer, manipulate, and/or process optical signals without increasing optical power and, more typically, by causing the optical signal(s) to incur some optical losses therein. Examples of passive optical components include but are not limited to optical switches, couplers, splitters, filters, and phase shifters.

FIG. 1 shows a block diagram of a PIC 100 according to an embodiment. PIC 100 includes photonic chips 102 and 106 that are optically and structurally coupled to one another using a chip-to-chip interface structure 110. In an example embodiment, PIC 100 is a part of an IC package (not explicitly shown in FIG. 1).

Photonic chip 102 is manufactured using a substrate 104. Photonic chip 106 is manufactured using a substrate 108. In an example embodiment, substrates 104 and 108 have different chemical composition. For example, substrate 104 may include a III-V semiconductor material or alloy. Substrate 108 may include silicon, silicon on insulator (SOI), or silica. Other combinations of substrate materials for substrates 104 and 108 are also possible in various alternative embodiments.

Photonic chip 102 comprises a plurality of optical gain elements $120_1$-$120_k$ and a corresponding plurality of optical waveguides $124_1$-$124_k$, where k is an integer greater than one. An optical gain element 120 typically includes a piece (e.g., a substantially rectangular block) of semiconductor material configured to operate as an active optical element or an optical gain medium. In an example embodiment, the semiconductor material(s) used in optical gain elements 120 may include variously doped III-V semiconductors and/or alloys. The semiconductor material(s) used in optical gain elements 120 may be different from the semiconductor material(s) of substrate 104. When appropriately electrically biased or pumped, an optical gain element 120 can generate light by way of spontaneous emission, stimulated emission, and/or other emission mechanism(s). The electrical connections and electrodes that can be used to apply electrical bias to optical gain elements $120_1$-$120_k$ are not explicitly shown in FIG. 1 for clarity of depiction. The configuration and design of such electrical connections and electrodes are well documented in the pertinent literature and known to persons of ordinary skill in the art.

A facet 116 of photonic chip 102 is covered by a highly reflective material, e.g., metal, to form a mirror 112 thereon. In operation, mirror 112 receives light from optical gain elements $120_1$-$120_k$ and reflects the received light back towards the optical gain elements. In a shown embodiment, mirror 112 is optically coupled to optical gain elements $120_1$-$120_k$ using optical waveguides $118_1$-$118_k$ that guide light between the mirror and the optical gain elements. In an alternative embodiment, optical waveguides $118_1$-$118_k$ may be omitted, and mirror 112 may be placed to be directly adjacent to the corresponding end facets of optical gain elements $120_1$-$120_k$.

In some embodiments, photonic chip 102 may have one or more of the following features known in the pertinent art: (i) a multiple quantum well (MQW) optical gain medium; (ii) a buried heterostructure device geometry; (iii) optical mode expanders and/or spot-size converters near or at chip-to-chip interface structure 110; (iv) tilted facets and coatings to reduce residual facet reflectivity; (v) electrodes configured for relatively high injection currents; and (vi) precision cleavability. In some other embodiments, a bulk gain medium and ridge waveguide structures may also be used. Example photonic chips that can be used to implement photonic chip 102 are disclosed, e.g., in (i) U.S. Patent Application Publication No. 2004/0100689; (ii) the article by A. Poustie, entitled "Hybrid Integration for Advanced Photonic Devices," published at pp. 29-32 of the proceedings of the 14th European Conference on Integrated Optics (ECIO) held in Eindhoven, The Netherlands, Jun. 11-13, 2008; (iii) the article by L. A. Coldren, et al., entitled "High-Performance InP-Based Photonic ICs—A Tutorial," published at pp. 554-570 of the IEEE Journal of Lightwave Technology, on Jan. 6, 2011, all of which are incorporated herein by reference in their entirety.

Photonic chip 108 comprises a plurality of photonic circuits $140_1$-$140_m$, where m is a positive integer greater than one. In an example embodiment, m≠k. However, embodiments where m=k are also possible. In some embodiments, each photonic circuit 140 may be functionally and/or structurally different from any other photonic circuit 140. In some embodiments, a subset of photonic circuits $140_1$-$140_m$ may include photonic circuits 140 that are nominally identical to one another. Some example embodiments of photonic circuits 140 are described in more detail below in reference to FIG. 3.

Photonic circuit $140_1$ is configured to receive light through an optical waveguide $132_1$ and to output light through each of optical waveguides $132_2$ and $142_1$. Optical waveguide $142_1$ is connected to a respective output port of photonic chip 106. Photonic circuit $140_2$ is configured to receive light through an optical waveguide $132_3$ and to output light through each of optical waveguides $132_4$ and $142_2$. Optical waveguide $142_2$ is connected to a respective output port of photonic chip 106. Photonic circuit $140_m$ is configured to receive light through an optical waveguide $132_j$ and to output light through an optical waveguide $142_m$, where j is a positive integer. Optical waveguide $142_m$ is connected to a respective output port of photonic chip 106. In some embodiments, j=2m−1. In some embodiments, some of optical waveguides $142_1$-$142_m$ may not be present or may not be configured to output any light.

Photonic chip 108 further comprises a plurality of 2×2 optical couplers $130_1$-$130_n$, where n is a positive integer. In an example embodiment, n≠k and n≠m. In some embodiments, n=m−1. In operation, an optical coupler 130 directs light between a corresponding pair of optical waveguides 128 and a corresponding pair of optical waveguides 132 connected thereto. In some embodiments, each of optical couplers $130_1$-$130_n$ may be implemented using a multimode interference (MMI) coupler, e.g., as described below in reference to FIG. 3.

Optical coupler $130_1$ has optical waveguides $128_2$, $128_3$, $132_2$, and $132_3$ connected thereto. In operation, optical coupler $130_1$ receives light from photonic circuit $140_1$ through optical waveguide $132_2$ and couples this light into both optical waveguides $128_2$ and $128_3$ for further coupling, through chip-to-chip interface structure 110, into photonic chip 102. Optical coupler $130_1$ also receives light back from photonic chip 102 through chip-to-chip interface structure 110 and optical waveguides $128_2$/$128_3$ and couples this light into optical waveguide $132_3$ for further coupling into photonic circuit $140_2$. Note that optical coupler $130_1$ enables the use of (i) unidirectional light propagation in each of optical waveguides $132_2$ and $132_3$ and (ii) bidirectional light propagation in each of optical waveguides $128_2$ and $128_3$, as indicated in FIG. 1 by the corresponding arrows. A more-detailed description of this feature of an optical coupler 130 is given below in reference to FIGS. 2A-2B. An example circuit structure of an optical coupler 130, including a configurable internal phase shifter appropriate configuration of which enables unidirectional light propagation in each of optical waveguides $132_2$ and $132_3$ and bidirectional light propagation in each of optical waveguides $128_2$ and $128_3$, is shown in FIG. 3 and described in more detail below in reference to that figure.

Optical coupler $130_n$ has optical waveguides $128_{j-1}$, $128_j$, $132_{j-1}$, and $132_j$ connected thereto. In operation, optical coupler $130_n$ receives light from photonic circuit $140_{m-1}$ (not explicitly shown in FIG. 1) through optical waveguide $132_{j-1}$ and couples this light into both optical waveguides $128_{j-1}$ and $128_j$ for further coupling, through chip-to-chip interface structure 110, into photonic chip 102. In addition, optical coupler $130_n$ receives light back from photonic chip 102 through chip-to-chip interface structure 110 and optical waveguides $128_{j-1}/128_j$ and couples this light into optical waveguide $132_j$ for further coupling into photonic circuit $140_m$. Similar to optical coupler $130_1$, optical coupler $130_n$ enables the use of (i) unidirectional light propagation in each of optical waveguides $132_{j-1}$ and $132_j$ and (ii) bidirectional light propagation in each of optical waveguides $128_{j-1}$ and $128_j$, as indicated in FIG. 1 by the corresponding arrows.

Chip-to-chip interface structure 110 is configured to optically couple optical waveguides 124 of photonic chip 102 and the corresponding optical waveguides 128 of photonic chip 106 as indicated in FIG. 1. More specifically, chip-to-chip interface structure 110 is configured to optically couple to one another the optical waveguides $124_1$-$124_3$ and the optical waveguides $128_1$-$128_3$, respectively. Chip-to-chip interface structure 110 is further configured to couple to one another (i) optical waveguides $124_{k-1}$ and $128_{j-1}$ and (ii) optical waveguides $124_k$ and $128_j$.

In an example embodiment, lithographic processes can be used to fabricate optical waveguides 124 and 128 in photonic chips 102 and 106, respectively. The corresponding lithographic masks can be designed such that the pitch between optical waveguides 124 of photonic chip 102 and the pitch between optical waveguides 128 of photonic chip 106 are nominally identical. This feature advantageously enables chip-to-chip interface structure 110 to have relatively low insertion losses between the corresponding optical waveguides 124 and 128. It also significantly simplifies the process of properly optically aligning the photonic chips 102 and 106 for bonding to one another and then packaging in the corresponding IC package.

In some embodiments, chip-to-chip interface structure 110 can be designed and configured for flip-chip bonding of photonic chips 102 and 106 to one another. In some alternative embodiments, chip-to-chip interface structure 110 can be designed and configured for edge-to-edge bonding of photonic chips 102 and 106 to one another. In some embodiments, chip-to-chip interface structure 110 can be configured to handle all of the optical-signal transfers between photonic chips 102 and 106. In some embodiments, chip-to-chip interface structure 110 is a monolithic structure adjacent to a single edge (e.g., a straight edge 114) of photonic chip 106, whereas other edges of photonic chip 106 do not have any additional distinct interface structures configured for optical-signal transfer between photonic chips 102 and 106.

Figure 2A:
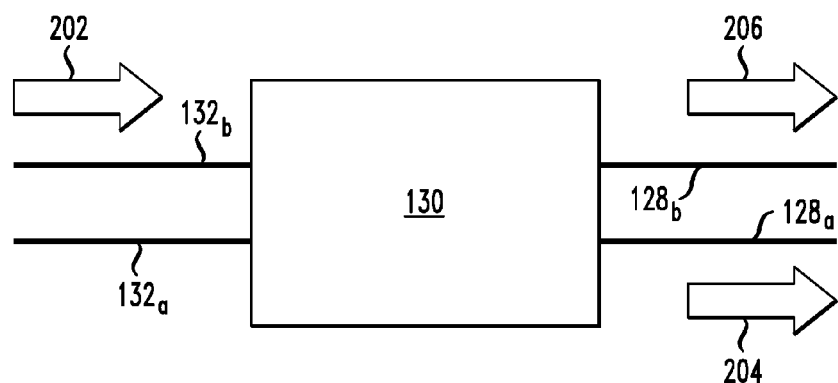
FIGS. 2A-2B illustrate the operation of an optical coupler used in the PIC of FIG. 1 according to an embodiment.
Figure 2B:
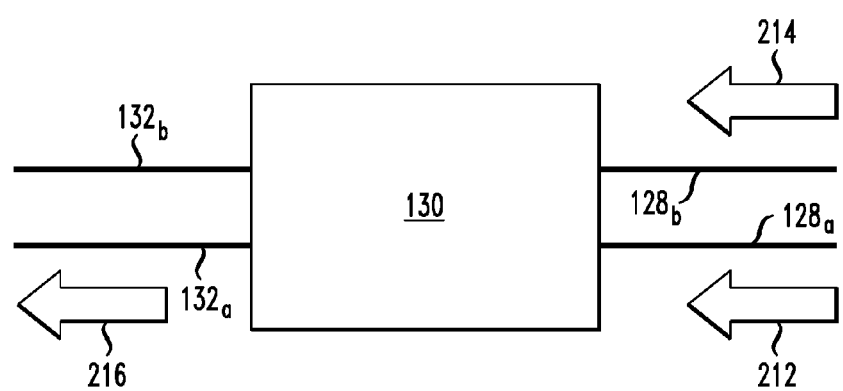
Figure 3:
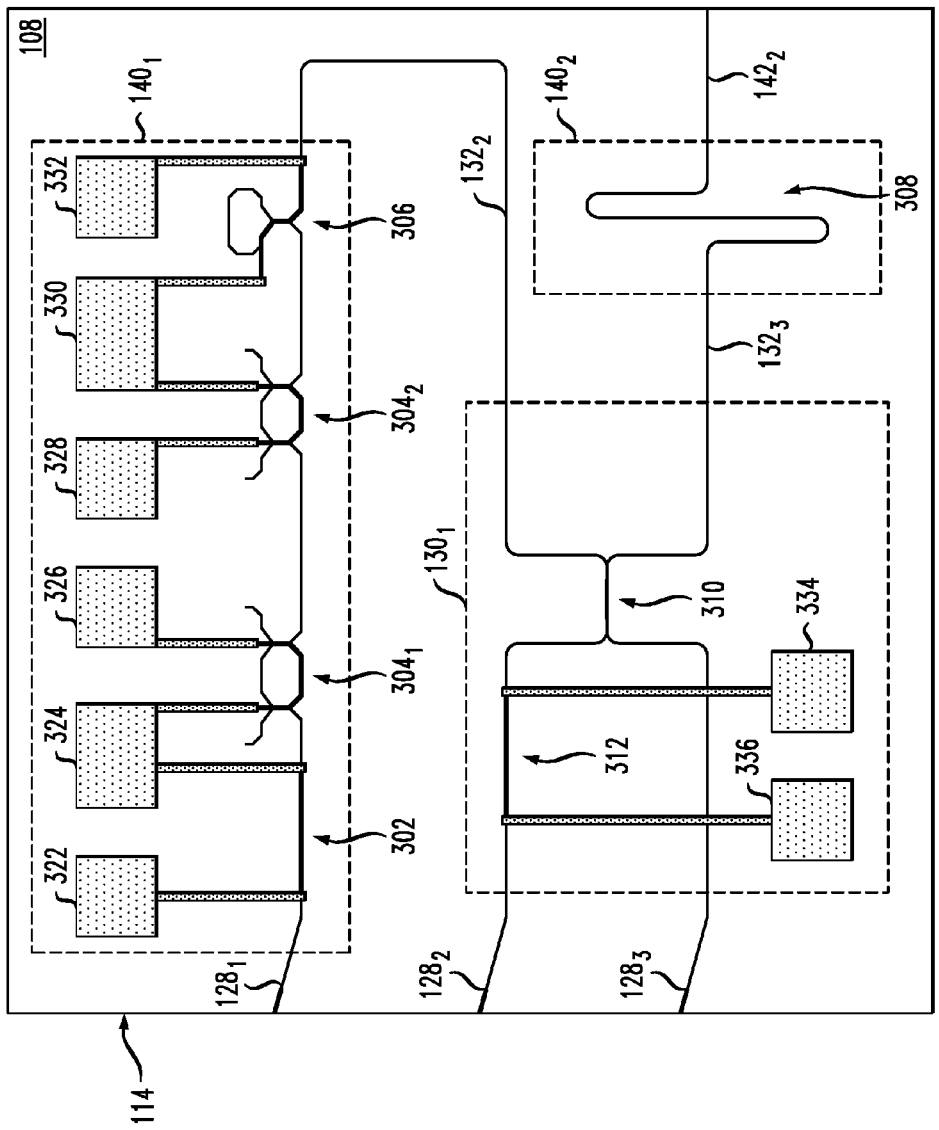
FIG. 3 shows a schematic top view of a photonic chip that can be used in the PIC of FIG. 1 according to an embodiment.

FIGS. 2A-2B illustrate the operation of an optical coupler 130 (FIG. 1) according to an example embodiment. For illustration purposes, the operation of optical coupler 130 is described below in reference to an embodiment in which optical coupler 130 comprises an MMI coupler. A person of ordinary skill in the art will understand that similar principles of operation can be implemented with any other suitable 2×2 optical coupler, e.g., a 3-dB directional waveguide coupler.

FIG. 2A illustrates the operation of optical coupler 130 when an optical signal 202 is applied to optical waveguide 132b while optical waveguide 132a receives no light. Optical waveguide 132b guides optical signal 202 using single-mode propagation. The larger transverse size of the MMI coupler used in optical coupler 130 causes optical signal 202 to couple thereto as a multimode optical signal. Multimode interference in the MMI coupler then causes (i) approximately one half of the optical power of optical signal 202 to couple into optical waveguide 128a as an optical signal 204 and (ii) approximately one half of the optical power of optical signal 202 to couple into optical waveguide 128b as an optical signal 206. The distance between the termini of optical waveguides 128a and 128b at the MMI coupler is such that it causes optical signals 204 and 206 to have a relative phase shift of about 90 degrees. Optical waveguides 128a and 128b guide optical signals 204 and 206 using single-mode propagation.

FIG. 2B illustrates the operation of optical coupler 130 when optical signals 212 and 214 are applied to optical waveguides 128a and 128b, respectively. More specifically, optical signals 212 and 214 have an approximately equal optical power and a relative phase shift of about 90 degrees. Note, however, that the phase shift between optical signals 212 and 214 has an opposite sign compared to the phase shift between optical signals 204 and 206 (FIG. 2A). In this situation, multimode interference in the MMI coupler of optical coupler 130 causes optical signals 212 and 214 to interfere constructively at the terminus of optical waveguide 132a, thereby launching an optical signal 216 into that optical waveguide. The multimode interference further causes optical signals 212 and 214 to interfere destructively at the terminus of optical waveguide 132b, which results in no optical signal being launched into that optical waveguide.

In some embodiments, optical coupler 130 may include one or more internal phase shifters or lengths of waveguide configured to provide the phase relationship between optical signals 202-206 and 212-214 illustrated in FIGS. 2A-2B. An example of such an embodiment of optical coupler 130 is shown in FIG. 3. In some alternative embodiments, the phase relationship between optical signals 202-206 and 212-214 illustrated in FIGS. 2A-2B can be created using one or more phase shifters or lengths of waveguide that are external to optical coupler 130.

FIG. 3 shows a schematic top view of a photonic chip 300 that can be used as photonic chip 106 (FIG. 1) according to an embodiment. More specifically, photonic chip 300 represents an embodiment of photonic chip 106 corresponding to k=j=3, n=1, and m=2. The correspondence between photonic chips 300 and 106 is also indicated by the labels used in FIG. 3, wherein some of the elements of photonic chip 300 are labeled using the same labels as the corresponding elements of photonic chip 106 in FIG. 1.

Edge 114 of photonic chip 300 is configured for being connected to chip-to-chip interface structure 110 and further to photonic chip 102 (also see FIG. 1). Optical waveguide $142_1$ is not present in photonic chip 300. In an example embodiment, photonic chip 300 can be used to implement a wavelength-tunable optical transmitter for WDM applications.

Photonic circuit $140_1$ of photonic chip 300 implements a passive portion and an output mirror of a laser cavity.

Optical gain element $120_1$ and mirror 112 of photonic chip 102 (see FIG. 1), which is to be optically connected to photonic circuit $140_1$ by optical waveguide $128_1$, are used to provide an active portion and the back mirror, respectively, of this laser cavity. Optical waveguide $132_2$ is configured to direct to optical coupler $130_1$ the light generated within the laser cavity and outputted therefrom by photonic circuit $140_1$. Optical coupler $130_1$ is configured to split the light received through optical waveguide $132_2$ into two approximately equal portions and apply these two portions to optical waveguides $128_2$ and $128_3$, respectively, e.g., as described above in reference to FIG. 2A. Each of these light portions is then amplified in the respective one of optical gain elements $120_2$ and $120_3$ of photonic chip 102 (see FIG. 1) and returned back to optical coupler $130_1$ through optical waveguides $128_2$ and $128_3$ due to the light being reflected by mirror 112 (also see FIG. 1). Optical coupler $130_1$ then operates to couple the amplified light into optical waveguide $132_3$, e.g., as described above in reference to FIG. 2B. Optical waveguide $132_3$ is configured to direct the light received from optical coupler $130_1$ to photonic circuit $140_2$. In the shown example embodiment, photonic circuit $140_2$ of photonic chip 300 comprises a fixed delay element 308. The light delayed by fixed delay element 308 is outputted from photonic chip 300 using optical waveguide $142_2$.

In an example embodiment, photonic circuit $140_1$ of photonic chip 300 comprises a phase shifter 302, two micro-ring wavelength filters labeled $304_1$ and $304_2$, and a Sagnac loop mirror 306 that are optically coupled to each other as indicated in FIG. 3. Photonic circuit $140_1$ of photonic chip 300 further comprises a plurality of electrical contact pads 322-332 that are electrically connected, as further indicated in FIG. 3, to the various electrodes used in phase shifter 302, micro-ring wavelength filters $304_1$ and $304_2$, and Sagnac loop mirror 306. In operation, electrical contact pads 322-332 are used to receive externally generated voltages that can be used to appropriately configure and control the shown elements of photonic circuit $140_1$.

The reflectivity of Sagnac loop mirror 306 can be controlled by a voltage applied between electrical contact pads 330 and 332, e.g., as described in U.S. Pat. No. 9,059,559, which is incorporated herein by reference in its entirety.

Since Sagnac loop mirror 306 only provides broadband reflection, narrow-band wavelength filtering provided by micro-ring wavelength filters $304_1$ and $304_2$ is used in photonic circuit $140_1$ to select and, if desired, tune the lasing wavelength of the corresponding laser. As known in the art, a micro-ring wavelength filter, such as each of filters $304_1$ and $304_2$, has a transmission spectrum comprising a comb of relatively narrow pass-bands whose center wavelengths are separated from one another by the filter's free spectral range (FSR). In an example embodiment, micro-ring wavelength filters $304_1$ and $304_2$ are designed and configured to have different FSRs. The spectral alignment of the pass-band comb corresponding to micro-ring wavelength filter $304_1$ can be controlled by the control voltage applied between electrical contact pads 324 and 326. The spectral alignment of the pass-band comb corresponding to micro-ring wavelength filter $304_2$ can similarly be controlled by the control voltage applied between electrical contact pads 328 and 330. Using the appropriately selected control voltages, micro-ring wavelength filters $304_1$ and $304_2$ can be tuned to have at least one common pass-band. A person of ordinary skill in the art will understand that the common pass-band of micro-ring wavelength filters $304_1$ and $304_2$ determines the lasing wavelength of the corresponding laser. The lasing wavelength can be tuned by appropriately changing the control voltages applied to micro-ring wavelength filters $304_1$ and $304_2$. The output optical power at the lasing wavelength can be optimized (e.g., maximized) by appropriately adjusting the control voltage applied to phase shifter 302 using electrical contact pads 322 and 324.

Optical coupler $130_1$ of photonic chip 300 comprises a 2×2 MMI coupler 310 and a phase shifter 312 optically coupled to each other as indicated in FIG. 3. Optical coupler $130_1$ of photonic chip 300 further comprises electrical contact pads 334 and 336 that are electrically connected to the electrode(s) used in phase shifter 312 as further indicated in FIG. 3. The relative phase difference between the optical paths corresponding to optical waveguides $128_2$ and $128_3$ can be changed by changing the control voltage applied to phase shifter 312 using electrical contact pads 322 and 324. In particular, this control voltage can be set to a value that enables the mode of operation described above in reference to FIGS. 2A-2B.

Figure 4:
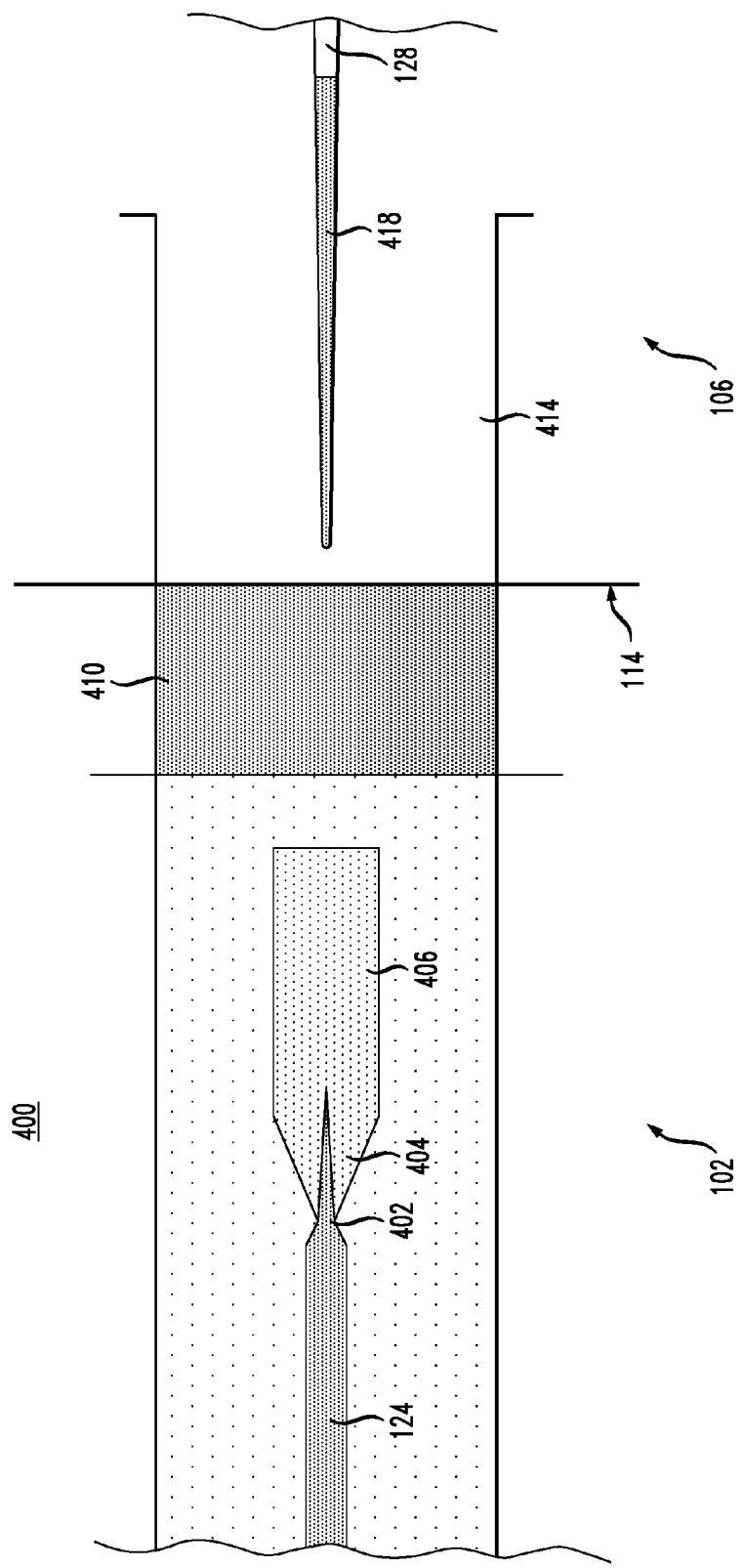
FIG. 4 shows a schematic top view of a waveguide structure that can be used in the PIC of FIG. 1 according to an embodiment.

FIG. 4 shows a schematic top view of a waveguide structure 400 that can be used to implement chip-to-chip interface structure 110 (FIG. 1) according to an embodiment. More specifically, a respective instance of waveguide structure 400 can be used to optically couple to one another each corresponding pair of optical waveguides 124 and 128 (also see FIG. 1). A person of ordinary skill in the art will understand that waveguide structure 400 is designed and configured to provide relatively low light-coupling losses between photonic chips 102 and 106.

Direct (e.g., without the use of waveguide structure 400) coupling of light between photonic chips 102 and 106 may suffer from relatively large optical losses because of the significant differences in the refractive indices of the materials used to implement optical waveguides in photonic chips 102 and 106. For example, Si-based photonic chips typically have much narrower optical waveguides than III-V semiconductor-based photonic chips. FIG. 4 indicates this waveguide-width difference by showing an optical waveguide 128 of photonic chip 106 to be narrower than the corresponding optical waveguide 124 of photonic chip 102. This waveguide-width difference causes the guided modes in optical waveguides 124 and 128 to have a large size mismatch, which would cause significant optical losses in the process of light transfer between these optical waveguides without the use of waveguide structure 400 or a functional equivalent thereof.

In an example embodiment, waveguide structure 400 operates to convert the spatially mismatched guided optical modes of optical waveguides 124 and 128 into substantially spatially matched optical modes within a spot-converter region 410. A person of ordinary skill in the art will understand that this spatial matching of the converted optical modes beneficially enables waveguide structure 400 to provide relatively low optical losses for the light transfer between optical waveguides 124 and 128.

Optical waveguide 128 is provided with an inverted taper 418 embedded in a wider cladding 414 made of a material having an intermediate refractive index. Inverted taper 418 causes the width of the waveguide core to be tapered to or below the cut-off width, at which the inverted taper can no longer support the optical mode corresponding to optical waveguide 128. As a result, the optical mode corresponding to optical waveguide 128 expands out and is converted into a much wider mode confined within the intermediate cladding 414.

Similar optical-mode conversion is implemented for the light guided by optical waveguide 124. More specifically, optical waveguide 124 is provided with an inverted taper 402 coupled to a wider intermediate cladding 406 having a tapered portion 404. Inverted taper 402 causes the optical mode corresponding to optical waveguide 124 to be converted into a wider optical mode guided by the intermediate cladding 406. The tapered portion 404 of intermediate cladding 406 then causes further optical mode expansion to a size corresponding to that of the optical mode guided by the cladding 414. The geometric size (e.g., the length) of the spot-converter region 410 is selected such as to cause the two converted optical modes to have an approximately optimal spatial overlap therein for efficient light transfer between photonic chips 102 and 106.

According to an example embodiment disclosed above in reference to FIGS. 1-4, provided is an apparatus (e.g., 100, FIG. 1) comprising: a first photonic chip (e.g., 102, FIG. 1) having a first plurality of optical waveguides (e.g., $124_1$-$124_k$, FIG. 1); and a second photonic chip (e.g., 106, FIG. 1; 300, FIG. 3) having a second plurality of optical waveguides (e.g., $128_1$-$128_j$, FIG. 1) and a third plurality of optical waveguides (e.g., $132_1$-$132_j$, FIG. 1), the second photonic chip being bonded to the first photonic chip to optically couple two or more optical waveguides of the second plurality to respective optical waveguides of the first plurality. The second photonic chip comprises a first 2×2 optical coupler (e.g., $130_1$, FIGS. 1 and 3) connected between first and second optical waveguides (e.g., $128_2$ and $128_3$, FIGS. 1 and 3) of the second plurality and first and second optical waveguides (e.g., $132_2$ and $132_3$, FIGS. 1 and 3) of the third plurality, the first 2×2 optical coupler being configured to: split light (e.g., 202, FIG. 2A) received from the first optical waveguide of the third plurality into first and second portions (e.g., 204 and 206, FIG. 2A) and couple (i) the first portion into the first optical waveguide of the second plurality and (ii) the second portion into the second optical waveguide of the second plurality; and couple light beams (e.g., 212 and 214, FIG. 2B) received from the first and second optical waveguides of the second plurality into the second optical waveguide of the third plurality in a manner that causes substantially no light of the light beams (e.g., less than 10% of the total optical power of 212 and 214, FIG. 2B) to be coupled into the first optical waveguide of the third plurality (e.g., as indicated by 216, FIG. 2B).

In some embodiments of the above apparatus, the first 2×2 optical coupler is configured to cause the first portion and the second portion to have approximately (e.g., to within 10%) equal optical power.

In some embodiments of any of the above apparatus, the first 2×2 optical coupler is further configured to couple the light beams received from the first and second waveguides of the second plurality into the second optical waveguide of the third plurality in a manner that causes substantially all optical power of the light beams (e.g., more than 50% of the total optical power of 212 and 214, FIG. 2B) to be coupled into the second optical waveguide of the third plurality (e.g., as indicated by 216, FIG. 2B).

In some embodiments of any of the above apparatus, the first 2×2 optical coupler comprises a phase shifter (e.g., 312, FIG. 3) configurable to change a relative phase shift between the light beams received from the first and second waveguides of the second plurality.

In some embodiments of any of the above apparatus, the first 2×2 optical coupler further comprises a multimode interference coupler (e.g., 310, FIG. 3).

In some embodiments of any of the above apparatus, the phase shifter is configured to cause the light beams to interfere constructively at the second optical waveguide of the third plurality and to interfere destructively at the first optical waveguide of the third plurality (e.g., as indicated in FIG. 2B).

In some embodiments of any of the above apparatus, the second photonic chip further comprises a second 2×2 optical coupler (e.g., $130_n$, FIG. 1) connected between third and fourth optical waveguides (e.g., $128_{j-1}$ and $128_j$, FIG. 1) of the second plurality and third and fourth optical waveguides (e.g., $132_{j-1}$ and $132_j$, FIG. 1) of the third plurality, the second 2×2 optical coupler being configured to: split light (e.g., 202, FIG. 2A) received from the third optical waveguide of the third plurality into respective first and second portions (e.g., 204 and 206, FIG. 2A) and couple (i) the first respective portion into the third optical waveguide of the second plurality and (ii) the second respective portion into the fourth optical waveguide of the second plurality; and couple respective light beams (e.g., 212 and 214, FIG. 2B) received from the third and fourth optical waveguides of the second plurality into the fourth optical waveguide of the third plurality in a manner that causes substantially no light of the respective light beams (e.g., less than 10% of the total optical power of 212 and 214, FIG. 2B) to be coupled into the third optical waveguide of the third plurality (e.g., as indicated by 216, FIG. 2B).

In some embodiments of any of the above apparatus, the second 2×2 optical coupler is nominally identical to the first 2×2 optical coupler.

In some embodiments of any of the above apparatus, the first photonic chip comprises: a first optical gain element (e.g., $120_2$, FIG. 1) optically coupled to the first optical waveguide of the second plurality by way of a first of the respective optical waveguides of the first plurality (e.g., $124_2$, FIG. 1); and a second optical gain element (e.g., $120_3$, FIG. 1) optically coupled to the second optical waveguide of the second plurality by way of a second of the respective optical waveguides of the first plurality (e.g., $124_3$, FIG. 1).

In some embodiments of any of the above apparatus, the first photonic chip is configured to generate the light beams using optical amplification in the first and second optical gain elements.

In some embodiments of any of the above apparatus, the first photonic chip further comprises a mirror (e.g., 112, FIG. 1) configured to cause each of the first and second optical gain elements to operate as a respective reflective optical amplifier.

In some embodiments of any of the above apparatus, the first photonic chip further comprises a third optical gain element (e.g., $120_1$, FIG. 1) optically coupled to a third optical waveguide (e.g., $128_1$, FIGS. 1 and 3) of the second plurality by way of a third of the respective optical waveguides of the first plurality (e.g., $124_1$, FIG. 1).

In some embodiments of any of the above apparatus, the second photonic chip further comprises a first photonic circuit (e.g., $140_1$, FIGS. 1 and 3) connected between the third optical waveguide of the second plurality and the first optical waveguide of the third plurality.

In some embodiments of any of the above apparatus, the second photonic chip further comprises a second photonic circuit (e.g., $140_2$, FIGS. 1 and 3) connected between the second optical waveguide of the third plurality and an output port (e.g., $142_2$, FIGS. 1 and 3) of the second photonic chip.

In some embodiments of any of the above apparatus, the first photonic circuit is configured to operate as an output mirror of a laser cavity that includes the third optical gain element.

In some embodiments of any of the above apparatus, the first photonic chip comprises a first semiconductor substrate (e.g., 104, FIG. 1); the second photonic chip comprises a second semiconductor substrate (e.g., 108, FIG. 1); and chemical composition of the first semiconductor substrate is different from chemical composition of the second semiconductor substrate.

In some embodiments of any of the above apparatus, the first semiconductor substrate comprises a III-V semiconductor or alloy; and the second semiconductor substrate comprises silicon.

In some embodiments of any of the above apparatus, the first photonic chip and the second photonic chip are bonded to one another using flip-chip bonding.

In some embodiments of any of the above apparatus, the first photonic chip and the second photonic chip are bonded to one another using edge-to-edge chip bonding.

In some embodiments of any of the above apparatus, a single straight edge (e.g., 114, FIGS. 1 and 3) of the second photonic chip has located thereat a respective terminus of each optical waveguide of the second plurality of optical waveguides (e.g., as shown in FIG. 1); and the second plurality of optical waveguides is configured to handle all optical-signal transfers between the first photonic chip and the second photonic chip.

In some embodiments of any of the above apparatus, the first photonic chip and the second photonic chip are parts of a photonic integrated circuit.

While this disclosure includes references to illustrative embodiments, this specification is not intended to be construed in a limiting sense. Various modifications of the described embodiments, as well as other embodiments within the scope of the disclosure, which are apparent to persons skilled in the art to which the disclosure pertains are deemed to lie within the principle and scope of the disclosure.

Unless explicitly stated otherwise, each numerical value and range should be interpreted as being approximate as if the word "about" or "approximately" preceded the value or range.

It will be further understood that various changes in the details, materials, and arrangements of the parts which have been described and illustrated in order to explain the nature of this disclosure may be made by those skilled in the art without departing from the scope of the disclosure, e.g., as expressed in the following claims.

Reference herein to "one embodiment" or "an embodiment" means that a particular feature, structure, or characteristic described in connection with the embodiment can be included in at least one embodiment of the disclosure. The appearances of the phrase "in one embodiment" in various places in the specification are not necessarily all referring to the same embodiment, nor are separate or alternative embodiments necessarily mutually exclusive of other embodiments. The same applies to the term "implementation."

Throughout the detailed description, the drawings, which are not to scale, are illustrative only and are used in order to explain, rather than limit the disclosure. The use of terms such as height, length, width, top, bottom, is strictly to facilitate the description of the embodiments and is not intended to limit the embodiments to a specific orientation. For example, height does not imply only a vertical rise limitation, but is used to identify one of the three dimensions of a three dimensional structure as shown in the figures. Such "height" would be vertical where the device layers are horizontal but would be horizontal where the device layers are vertical, and so on. Similarly, while some figures show the different layers as horizontal layers such orientation is for descriptive purpose only and not to be construed as a limitation.

Also for purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements.

The described embodiments are to be considered in all respects as only illustrative and not restrictive. In particular, the scope of the disclosure is indicated by the appended claims rather than by the description and figures herein. All changes that come within the meaning and range of equivalency of the claims are to be embraced within their scope.

The description and drawings merely illustrate the principles of the disclosure. It will thus be appreciated that those of ordinary skill in the art will be able to devise various arrangements that, although not explicitly described or shown herein, embody the principles of the disclosure and are included within its spirit and scope. Furthermore, all examples recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions. Moreover, all statements herein reciting principles, aspects, and embodiments of the disclosure, as well as specific examples thereof, are intended to encompass equivalents thereof.

It should be appreciated by those of ordinary skill in the art that any block diagrams herein represent conceptual views of illustrative circuitry embodying the principles of the disclosure. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

What is claimed is:

1. An apparatus comprising:
    a first photonic chip having a first plurality of optical waveguides; and
    a second photonic chip having a second plurality of optical waveguides and a third plurality of optical waveguides, the second photonic chip being bonded to the first photonic chip to optically couple two or more optical waveguides of the second plurality to respective optical waveguides of the first plurality; and
    wherein the second photonic chip comprises a first 2×2 optical coupler connected between first and second optical waveguides of the second plurality and first and second optical waveguides of the third plurality, the first 2×2 optical coupler being configured to:
        split light received from the first optical waveguide of the third plurality into first and second portions and couple (i) the first portion into the first optical waveguide of the second plurality and (ii) the second portion into the second optical waveguide of the second plurality; and
        couple light beams received from the first and second optical waveguides of the second plurality into the second optical waveguide of the third plurality in a manner that causes substantially no light of the light beams to be coupled into the first optical waveguide of the third plurality.

2. The apparatus of claim 1, wherein the first 2×2 optical coupler is configured to cause the first portion and the second portion to have approximately equal optical power.

3. The apparatus of claim 1, wherein the first 2×2 optical coupler is further configured to couple the light beams received from the first and second waveguides of the second plurality into the second optical waveguide of the third plurality in a manner that causes substantially all optical power of the light beams to be coupled into the second optical waveguide of the third plurality.

4. The apparatus of claim 1, wherein the first 2×2 optical coupler comprises a phase shifter configurable to change a relative phase shift between the light beams received from the first and second waveguides of the second plurality.

5. The apparatus of claim 4, wherein the first 2×2 optical coupler further comprises a multimode interference coupler.

6. The apparatus of claim 4, wherein the phase shifter is configured to cause the light beams to interfere constructively at the second optical waveguide of the third plurality and to interfere destructively at the first optical waveguide of the third plurality.

7. The apparatus of claim 1, wherein the second photonic chip further comprises a second 2×2 optical coupler connected between third and fourth optical waveguides of the second plurality and third and fourth optical waveguides of the third plurality, the second 2×2 optical coupler being configured to:
split light received from the third optical waveguide of the third plurality into respective first and second portions and couple (i) the first respective portion into the third optical waveguide of the second plurality and (ii) the second respective portion into the fourth optical waveguide of the second plurality; and
couple respective light beams received from the third and fourth optical waveguides of the second plurality into the fourth optical waveguide of the third plurality in a manner that causes substantially no light of the respective light beams to be coupled into the third optical waveguide of the third plurality.

8. The apparatus of claim 7, wherein the second 2×2 optical coupler is nominally identical to the first 2×2 optical coupler.

9. The apparatus of claim 1, wherein the first photonic chip comprises:
a first optical gain element optically coupled to the first optical waveguide of the second plurality by way of a first of the respective optical waveguides of the first plurality; and
a second optical gain element optically coupled to the second optical waveguide of the second plurality by way of a second of the respective optical waveguides of the first plurality.

10. The apparatus of claim 9, wherein the first photonic chip is configured to generate the light beams using optical amplification in the first and second optical gain elements.

11. The apparatus of claim 9, wherein the first photonic chip further comprises a mirror configured to cause each of the first and second optical gain elements to operate as a respective reflective optical amplifier.

12. The apparatus of claim 9, wherein the first photonic chip further comprises a third optical gain element optically coupled to a third optical waveguide of the second plurality by way of a third of the respective optical waveguides of the first plurality.

13. The apparatus of claim 12, wherein the second photonic chip further comprises a first photonic circuit connected between the third optical waveguide of the second plurality and the first optical waveguide of the third plurality.

14. The apparatus of claim 13, wherein the second photonic chip further comprises a second photonic circuit connected between the second optical waveguide of the third plurality and an output port of the second photonic chip.

15. The apparatus of claim 13, wherein the first photonic circuit is configured to operate as an output mirror of a laser cavity that includes the third optical gain element.

16. The apparatus of claim 1, wherein:
the first photonic chip comprises a first semiconductor substrate;
the second photonic chip comprises a second semiconductor substrate; and
chemical composition of the first semiconductor substrate is different from chemical composition of the second semiconductor substrate.

17. The apparatus of claim 16, wherein:
the first semiconductor substrate comprises a III-V semiconductor or alloy; and
the second semiconductor substrate comprises silicon.

18. The apparatus of claim 1, wherein the first photonic chip and the second photonic chip are bonded to one another using flip-chip bonding.

19. The apparatus of claim 1, wherein the first photonic chip and the second photonic chip are bonded to one another using edge-to-edge chip bonding.

20. The apparatus of claim 1, wherein the first photonic chip and the second photonic chip are parts of a photonic integrated circuit.

* * * * *